US010966286B2

(12) United States Patent
Bremensdorfer et al.

(10) Patent No.: US 10,966,286 B2
(45) Date of Patent: Mar. 30, 2021

(54) NITROGEN INJECTION FOR ARC LAMPS

(71) Applicants:Mattson Technology, Inc., Fremont, CA (US); Beijing E-Town Semiconductor Technology Co., Ltd., Beijing (CN)

(72) Inventors: Rolf Bremensdorfer, Bibertal (DE); Dave Camm, Vancouver (CA); Pete Lembesis, Langley (CA); Joseph Cibere, Burnaby (CA)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 1006 days.

(21) Appl. No.: 15/380,139

(22) Filed: Dec. 15, 2016

(65) Prior Publication Data

US 2017/0196046 A1   Jul. 6, 2017

Related U.S. Application Data (60) Provisional application No. 62/272,942, filed on Dec. 30, 2015.

(51) Int. Cl.
*H05B 3/00* (2006.01)
*H01L 21/67* (2006.01)
(Continued)

(52) U.S. Cl.
CPC ........ *H05B 3/0047* (2013.01); *H01J 61/0732* (2013.01); *H01J 61/526* (2013.01);
(Continued)

(58) Field of Classification Search
CPC ...... H05B 3/0047; H01J 61/0732; H01J 1/526
(Continued)

(56) References Cited

U.S. PATENT DOCUMENTS

| 5,394,058 A | | 2/1995 | Rolski et al. |
| 5,607,644 A | * | 3/1997 | Olstein ............. G01N 21/6428 385/117 |

(Continued)

FOREIGN PATENT DOCUMENTS

| KR | 20140077251 | 6/2014 |
| WO | WO2005078762 | 8/2005 |

OTHER PUBLICATIONS

PCT International Preliminary Report on Patentability for Corresponding PCT Application No. PCT/US2016/066891, dated Jul. 12, 2018—10 pages.

(Continued)

*Primary Examiner* — Tu B Hoang
*Assistant Examiner* — Thomas J Ward
(74) *Attorney, Agent, or Firm* — Dority & Manning, P.A.

(57) ABSTRACT

Systems and methods for reducing contamination of one or more arc lamps are provided. One example implementation is directed to a millisecond anneal system. The millisecond anneal system includes a processing chamber for thermally treating a substrate using a millisecond anneal process. The system further includes one or more arc lamps. Each of the one or more arc lamps is coupled to a water loop for circulating water through the arc lamp during operation of the arc lamp. The system includes a reagent injection source configured to introduce a reagent, such as nitrogen gas, into water circulating through the arc lamp during operation of the arc lamp.

9 Claims, 10 Drawing Sheets

(51) Int. Cl.
*H01J 61/52* (2006.01)
*H01J 61/073* (2006.01)
*H05B 31/00* (2006.01)

(52) U.S. Cl.
CPC .... *H01L 21/6719* (2013.01); *H01L 21/67109* (2013.01); *H01L 21/67115* (2013.01); *H01L 21/67248* (2013.01); *H05B 31/0057* (2013.01)

(58) Field of Classification Search
USPC .................................................. 392/416, 418
See application file for complete search history.

(56) References Cited

U.S. PATENT DOCUMENTS

| | | | |
|---|---|---|---|
| 5,736,813 | A | 4/1998 | Foust et al. |
| 6,204,203 | B1 | 3/2001 | Narwankar et al. |
| 7,442,415 | B2 | 10/2008 | Conley, Jr. et al. |
| 7,781,947 | B2 * | 8/2010 | Camm ............... H01J 9/38 313/22 |
| 7,790,633 | B1 | 9/2010 | Tarafdar et al. |
| 8,323,754 | B2 | 12/2012 | Olsen et al. |
| 8,809,175 | B2 | 8/2014 | Tsai et al. |
| 9,093,468 | B2 | 7/2015 | Tsai et al. |
| 2003/0122489 | A1 | 7/2003 | Mizoziri et al. |
| 2005/0062388 | A1 | 3/2005 | Camm et al. |
| 2005/0179354 | A1 | 8/2005 | Camm et al. |
| 2010/0276611 | A1 | 11/2010 | Camm et al. |
| 2011/0274417 | A1 | 11/2011 | Camm et al. |
| 2012/0288970 | A1 | 11/2012 | Hashimoto et al. |
| 2015/0140838 | A1 | 5/2015 | Kashefi et al. |

OTHER PUBLICATIONS

Ragnarsson et al., "The Importance of Moisture Control for EOT Scaling of Hf-Based Dielectrics," *Journal of the Electrochemical Society*, vol. 156, Issue 6, Apr. 3, 2009, pp. H416-H423.

Ferrari et al., "Diffusion Reaction of Oxygen in HfO2/SiO2/Si Stacks," *The Journal of Physical Chemistry B*, vol. 110, No. 30, Jul. 12, 2006, pp. 14905-14910.

Driemeier et al., "Thermochemical behavior of hydrogen in hafnium silicate films on Si," Applied Physics Letters, vol. 89, Issue 5, Aug. 2006,—4 pages.

Driemeier et al., "Room temperature interactions of water vapor with Hf O2 films on Si," Applied Physics Letters, vol. 88, Issue 20, May 2006—3 pages.

Conley, Jr. et al., "Densification and improved electrical properties of pulse-deposited films via in situ modulated temperature annealing," *Applied Physics Letters*, vol. 84, Issue 11, Mar. 15, 2004, pp. 1913-1915.

Nakajima et al., "Experimental Demonstration of Higher-k phase HfO2 through Non-equilibrium Thermal Treatment," ECS Transactions 28.2 (2010), pp. 203-212.

Wu et al., "Device Performance and Reliability Improvement for MOSFETs With HfO2 Gate Dielectrics Fabricated Using Multideposition Room-Temperature Multiannealing," IEEE Electron Device Letters, vol. 32, Issue 9, Sep. 2011, pp. 1173-1175.

PCT International Search Report for corresponding PCT Application No. PCT/US2016/066891, dated Apr. 10, 2017—4 pages.

* cited by examiner

NITROGEN INJECTION FOR ARC LAMPS

PRIORITY CLAIM

The present application claims the benefit of priority of U.S. Provisional Application Ser. No. 62/272,942, filed on Dec. 30, 2015, entitled "Nitrogen Injection for Lamps in a Millisecond Anneal System," which is incorporated herein by reference.

FIELD

The present disclosure relates generally to arc lamps that can be used, for instance, in millisecond anneal systems for thermal processing of substrates, such as semiconductor substrates.

BACKGROUND

Millisecond anneal systems can be used for semiconductor processing for the ultra-fast heat treatment of substrates, such as silicon wafers. In semiconductor processing, fast heat treatment can be used as an anneal step to repair implant damage, improve the quality of deposited layers, improve the quality of layer interfaces, to activate dopants, and to achieve other purposes, while at the same time controlling the diffusion of dopant species.

Millisecond, or ultra-fast, temperature treatment of semiconductor substrates can be achieved using an intense and brief exposure of light to heat the entire top surface of the substrate at rates that can exceed $10^{4\circ}$ C. per second. The rapid heating of just one surface of the substrate can produce a large temperature gradient through the thickness of the substrate, while the bulk of the substrate maintains the temperature before the light exposure. The bulk of the substrate therefore acts as a heat sink resulting in fast cooling rates of the top surface.

SUMMARY

Aspects and advantages of embodiments of the present disclosure will be set forth in part in the following description, or may be learned from the description, or may be learned through practice of the embodiments.

One example aspect of the present disclosure is directed to a millisecond anneal system. The millisecond anneal system includes a processing chamber for thermally treating a semiconductor substrate using a millisecond anneal process. The system further includes one or more arc lamps. Each of the one or more arc lamps is coupled to a water loop for circulating water through the arc lamp during operation of the arc lamp. The system includes a nitrogen gas injection source or other reagent source configured to introduce nitrogen gas or other reagent into water circulating through the arc lamp during operation of the arc lamp.

Variations and modification can be made to the example aspects of the present disclosure. Other example aspects of the present disclosure are directed to systems, methods, devices, and processes for thermally treating a semiconductor substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Overview

Example aspects of the present disclosure are directed to controlling the pH-value of water used in arc lamps to reduce the deposits of contaminants on the arc lamps.

Aspects of the present disclosure will be discussed with reference to arc lamps used in conjunction with millisecond anneal systems for purposes of illustration and discussion. Those of ordinary skill in the art, using the disclosures provided herein, will understand that aspects of the present disclosure can be used with arc lamps in other applications, such as for processing of metals (e.g., melting a surface of steel), and other applications.

In addition, aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. The use of the term "about" in conjunction with a numerical value is intended to refer to within 10% of the stated numerical value.

Millisecond, or ultra-fast, thermal treatment of semiconductor substrates can be achieved using an intense and brief exposure of light to heat the entire top surface of the substrate at rates that can exceed $10^{4°}$ C./sec. The flash of light can be applied to a substrate, which was previously heated to an intermediate temperature $T_i$ at ramp rates of up to 150° C./sec. The flash can be applied by one or more flash arc lamps located at, for instance, the top of a processing chamber. The slower heating process to the intermediate temperature $T_i$ can be accomplished by one or more continuous mode arc lamps located at, for instance, the bottom side of a processing chamber. These continuous mode lamps can heat the entire bulk of the wafer through the bottom surface of the wafer.

As discussed in detail below, the arc lamps used in millisecond anneal systems according to example aspects of the present disclosure can be open flow arc lamps, where pressurized Argon gas is converted into a high pressure Argon plasma during an arc discharge. The arc discharge takes place between a negatively charged cathode and a positively charged anode spaced, for instance, about 300 mm apart. As soon as the voltage between the electrodes reaches the breakdown voltage (e.g., about 30 kV) of Argon, a stable, low inductive Argon plasma is formed which emits light in the visible and UV range of the spectrum.

Both the flash arc lamps and continuous mode arc lamps can use the same basic construction principle. The plasma can be contained within a quartz tube envelope which can be water cooled from the inside by a water wall. The water wall can be injected at high flow rates on the cathode end of the lamp and can be exhausted at the anode end or vice versa. The same can be true for the Argon gas, which can also enter the lamp at the cathode side and can be exhausted from the anode side or vice versa. The water forming the water wall is injected perpendicular to the lamp axis such that the centrifugal action generates a water vortex. Hence, along the center line of the lamp a channel is formed for the Argon gas. The Argon gas column can rotate in the same direction as the water wall. Once a plasma has formed, the water wall can protect the quartz tube and can confine the plasma to the center axis such that the water wall and/or the electrodes are in direct contact with the high energy plasma. As the electrodes experience a high heat load, the tips are made from tungsten and fused to a water cooled copper heat sink. The copper heat sink constitutes one part of the internal cooling system of the electrodes, with the other part being located in the brass base of the electrode.

As discussed in detail below, the arc lamps can each be an open flow system for water and Argon gas. However, for conservation reasons, both media can be circulated in a closed loop. High purity water and Argon can be fed to the lamp. The high purity water is used for the water-wall and the cooling of the electrodes. Leaving the lamp is a gas/water mixture. This water/gas mixture needs to be separated into gas free water and liquid water free Argon before it can be re-fed to the inlets of the lamp. In order to generate the required pressure drop across the lamp, the gas/water mixture can be pumped by a water driven jet pump.

A high power electric pump can supply water pressure to drive the water wall in the lamp, the cooling water for the lamp electrodes, and the motive flow for the jet pump. A separator vessel downstream to the jet pump can extract the liquid and the gaseous phase from the mixture (Argon). Argon can be further dried in a coalescing filter before it re-enters the lamp.

The water can be passed through particle filters to remove particles sputtered into the water by the arc. Ionic contaminations can be removed by ion exchange resins. A portion of the water can be run through mixed bed ion exchange filters. The inlet valve to the ion exchange bypass can be controlled by the water resistivity. If the water resistivity drops below a lower value, the valve can be opened. When it reaches an upper value, the valve can be closed. The system can also contain an activated carbon filter bypass loop where a portion of the water can be additionally filtered to remove organic contaminations. To maintain the water temperature the water can pass through a heat exchanger.

During the operation of an arc lamp, the high-energy, high-temperature plasma can interact physically and chemically with the electrode material and the water. This can result in the contamination of the lamp water mainly by copper, tungsten, and their oxides. The water solubility of contaminating species is determined by the pH value of the water. At a pH-value greater than about 7, the inner surface of the lamp tube can be coated by a brownish deposit. As the deposit builds up, the light output of the lamp decreases. Eventually wafers are miss-processed, because the intermediate temperature cannot be reached from light output by the continuous mode arc lamps. Due to its appearance, the formation of the deposit is called lamp browning. The deposit predominately consists of copper, copper oxides, with lower amounts of tungsten, and tungsten oxides present as well.

According to example aspects of the present disclosure, the pH-value of the water used in arc lamps of a millisecond anneal system can be controlled to be in a range of, for instance about 5.5 to about 8.0, such as 6.5 to about 7.0 by controlling the concentration of acids formed from the reaction of nitrogen with water in the presence of a high-energy plasma. A pH-value that is too low can lead to issues with conductivity in the arc lamp. In some embodiments, a reagent can be injected into the arc lamp during operation to control the pH-value of the water circulating through the arc lamp. In some embodiments, nitrogen gas is added to the water and the high-energy plasma inside the lamp to generate nitrous and nitric acid.

For instance, one example embodiment of the present disclosure is directed to a millisecond anneal system. The system includes a processing chamber for thermally treating a semiconductor substrate using a millisecond anneal process. The system can include one or more arc lamps. Each of the one or more arc lamps can be coupled to a water loop for circulating water through the arc lamp during operation of the arc lamp. The system can include a nitrogen injection source configured to introduce nitrogen gas into water circulating through the arc lamp during operation of the arc lamp. As used herein "water" refers to pure water or any mixture that includes water.

In some embodiments, the nitrogen gas injection source can be arranged in the water loop to introduce nitrogen into the water prior to the water entering the arc lamp. In embodiments, the water loop can include a jet pump configured to generate a pressure drop across the arc lamp. The nitrogen gas injection source can be configured to introduce nitrogen gas at a suction port of the jet pump.

In some embodiments, the water loop can include an inlet for providing Argon gas to the lamp. The arc lamp can exhaust an Argon gas/water mixture into the water loop. The water loop can include a separator configured to separate the Argon gas from water in the Argon gas/water mixture. In some embodiments, the water loop can include one or more particle filters configured to remove particles sputtered into the water by a plasma arc.

In some embodiments, the system can include a pH sensor configured to measure a pH-value of water in the water loop. The system can include one or more control devices configured to control the injection of nitrogen gas into the water circulating through the arc lamp during operation of the arc lamp. The one or more control devices can be configure to control operation of a nitrogen gas injection valve to introduce nitrogen into water circulating through the water loop based at least in part on data indicative of the pH-value measured by the pH sensor and data indicative of the state of arc lamp operation.

Another example embodiment of the present disclosure is directed to a method of operating a water loop for circulating water through an arc lamp in a millisecond anneal system. The method can include: obtaining, by one or more control devices, data indicative of a pH-value of water circulating through the water loop; obtaining, by the one or more control devices, data indicative of the state of arc lamp operation; and adjusting a pH-value of the water circulating through the arc lamp based at least in part on the data indicative of the pH-value of the water.

In some embodiments, adjusting a pH-value of the water circulating through the arc lamp includes: determining, by the one or more control devices, an operating position for a nitrogen injection valve for injecting nitrogen into the water loop based at least in part on the data indicative of the pH-value of water circulating through the arc lamp and the data indicative of the state of arc lamp operation; and controlling, by the one or more control devices, the nitrogen injection valve based on the determined operating position.

The operating position for the nitrogen injection valve can be determined to be open when the pH-value of the water is above an upper limit and the state of arc lamp operation is an on state. The operating position for the nitrogen injection valve can be determined to be closed when the state of arc lamp operation is an off state. The operating position for the nitrogen injection valve can be determined to be closed when the pH-value of the water is below a lower limit. In some embodiments, the upper limit can be about 7.0 and the lower limit can be about 6.5.

Another example embodiment of the present disclosure is directed to an arc lamp system. The system includes a plurality of electrodes. The system can include one or more inlets to an arc tube configured to receive water from a water loop to be circulated through the arc lamp. The one or more inlets can be configured to receive a gas (e.g. Argon gas). During operation of the arc lamp, the gas can be converted into a plasma during an arc discharge between the plurality of electrodes. The water loop can include a valve for injection of a reagent into the arc lamp during operation to reduce a deposit of contaminants on the arc lamp. In some embodiments, the reagent can be nitrogen gas. In some embodiments, the reagent can be an acid. In some embodiments, the arc lamp system can be used as part of a millisecond anneal system.

EXAMPLE MILLISECOND ANNEAL SYSTEMS

Figure 1:
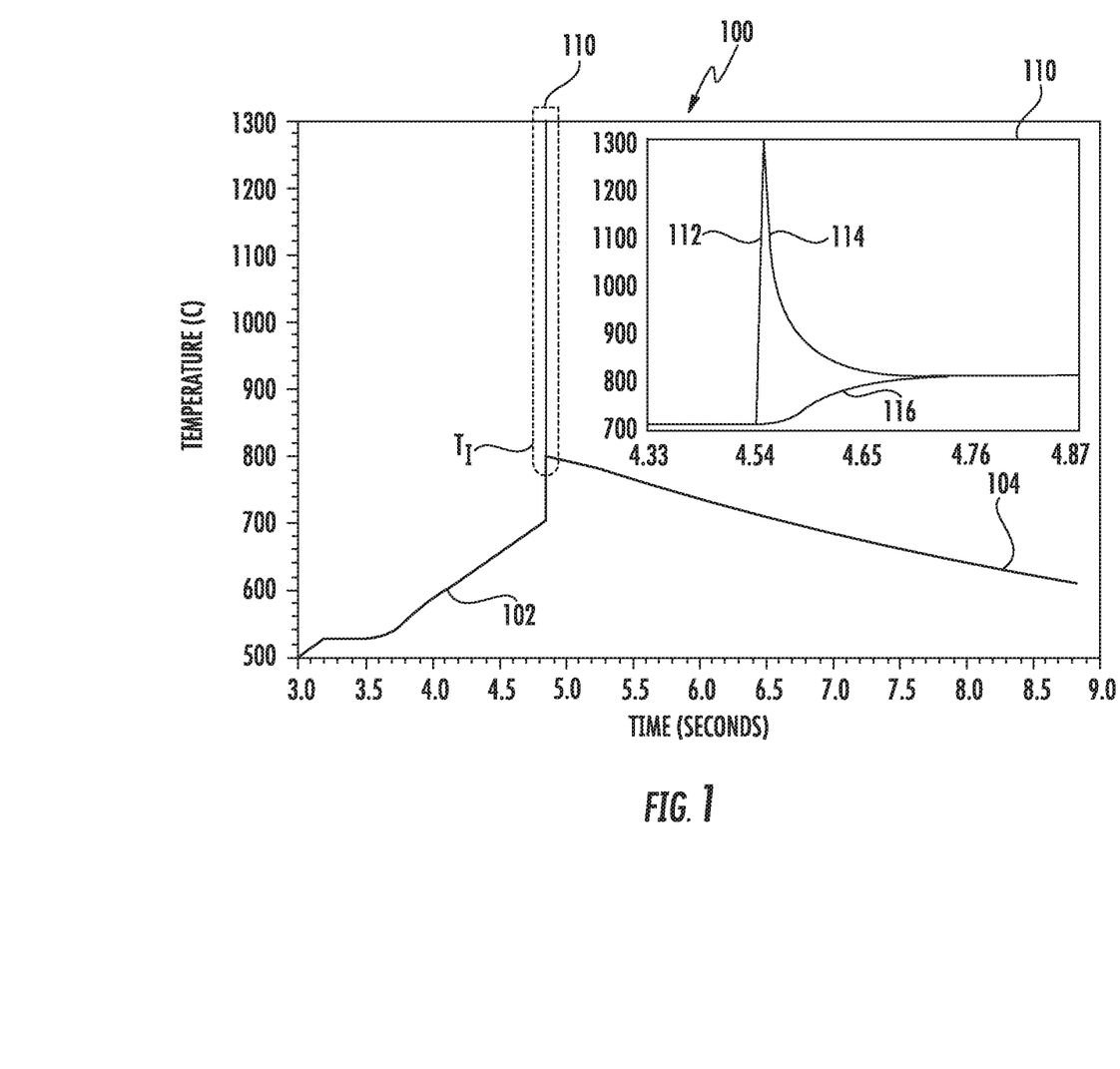
FIG. 1 depicts an example millisecond anneal heating profile according to example embodiments of the present disclosure.

An example millisecond anneal system can be configured to provide an intense and brief exposure of light to heat the top surface of a wafer at rates that can exceed, for instance, about $10^{4°}$ C./s. FIG. 1 depicts an example temperature profile 100 of a semiconductor substrate achieved using a millisecond anneal system. As shown in FIG. 1, the bulk of the semiconductor substrate (e.g., a silicon wafer) is heated to an intermediate temperature $T_i$ during a ramp phase 102. The intermediate temperature can be in the range of about 450° C. to about 900° C. When the intermediate temperature $T_i$ is reached, the top side of the semiconductor substrate can be exposed to a very short, intense flash of light resulting in heating rates of up to about $10^{4°}$ C./s. Window 110 illustrates the temperature profile of the semiconductor substrate during the short, intense flash of light. Curve 112 represents the rapid heating of the top surface of the semiconductor substrate during the flash exposure. Curve 116 depicts the temperature of the remainder or bulk of the semiconductor substrate during the flash exposure. Curve 114 represents the rapid cool down by conductive of cooling of the top surface of the semiconductor substrate by the bulk of the semiconductor substrate acting as a heat sink. The bulk of the semiconductor substrate acts as a heat sink generating high top side cooling rates for the substrate. Curve 104 represents the slow cool down of the bulk of the semiconductor substrate by thermal radiation and convection, with a process gas as a cooling agent.

An example millisecond anneal system can include a plurality of arc lamps (e.g., four Argon arc lamps) as light sources for intense millisecond long exposure of the top surface of the semiconductor substrate—the so called "flash." The flash can be applied to the semiconductor substrate when the substrate has been heated to an intermediate temperature (e.g., about 450° C. to about 900° C.). A plurality of continuous mode arc lamps (e.g., two Argon arc lamps) can be used to heat the semiconductor substrate to the intermediate temperature. In some embodiments, the heating of the semiconductor substrate to the intermediate temperature can be accomplished through the bottom surface of the semiconductor substrate at a ramp rate which heats the entire bulk of the wafer.

Figure 2:
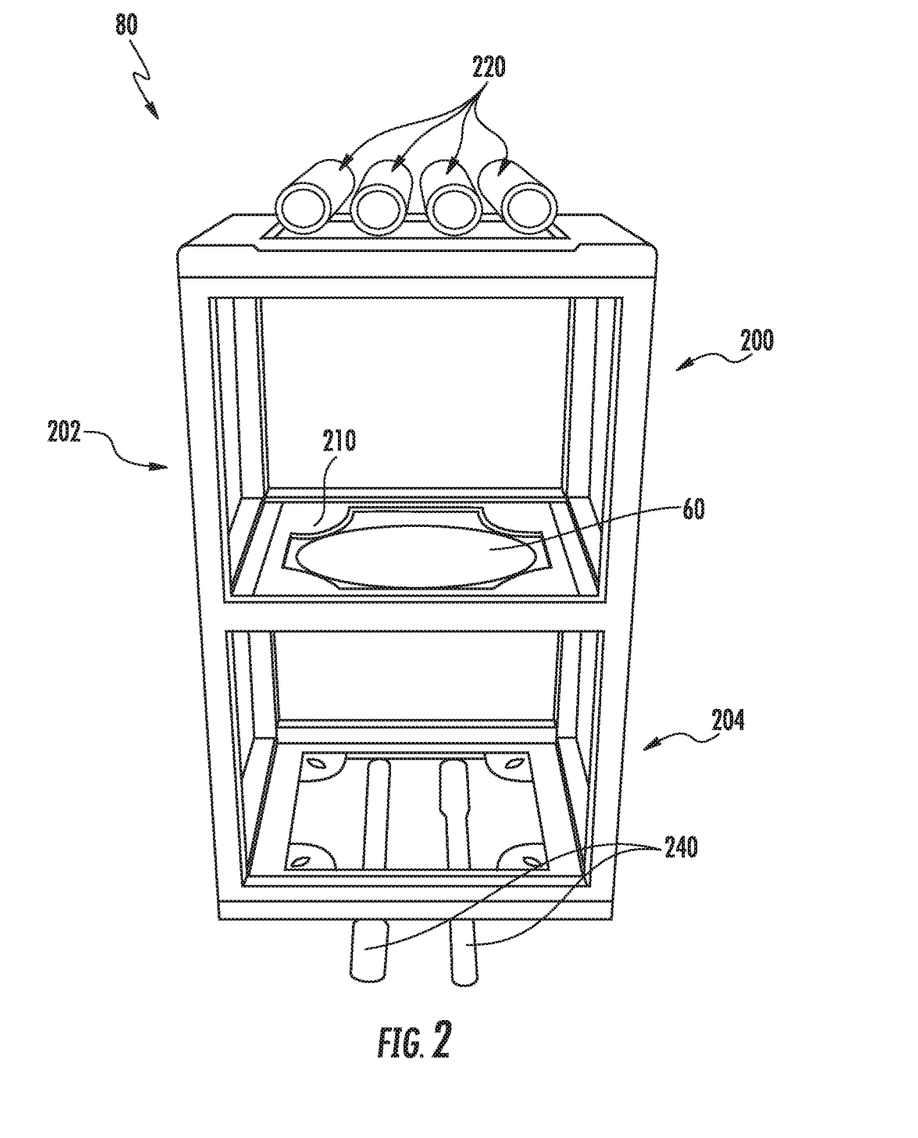
FIG. 2 depicts an example perspective view of a portion of an example millisecond anneal system according to example embodiments of the present disclosure.
Figure 3:
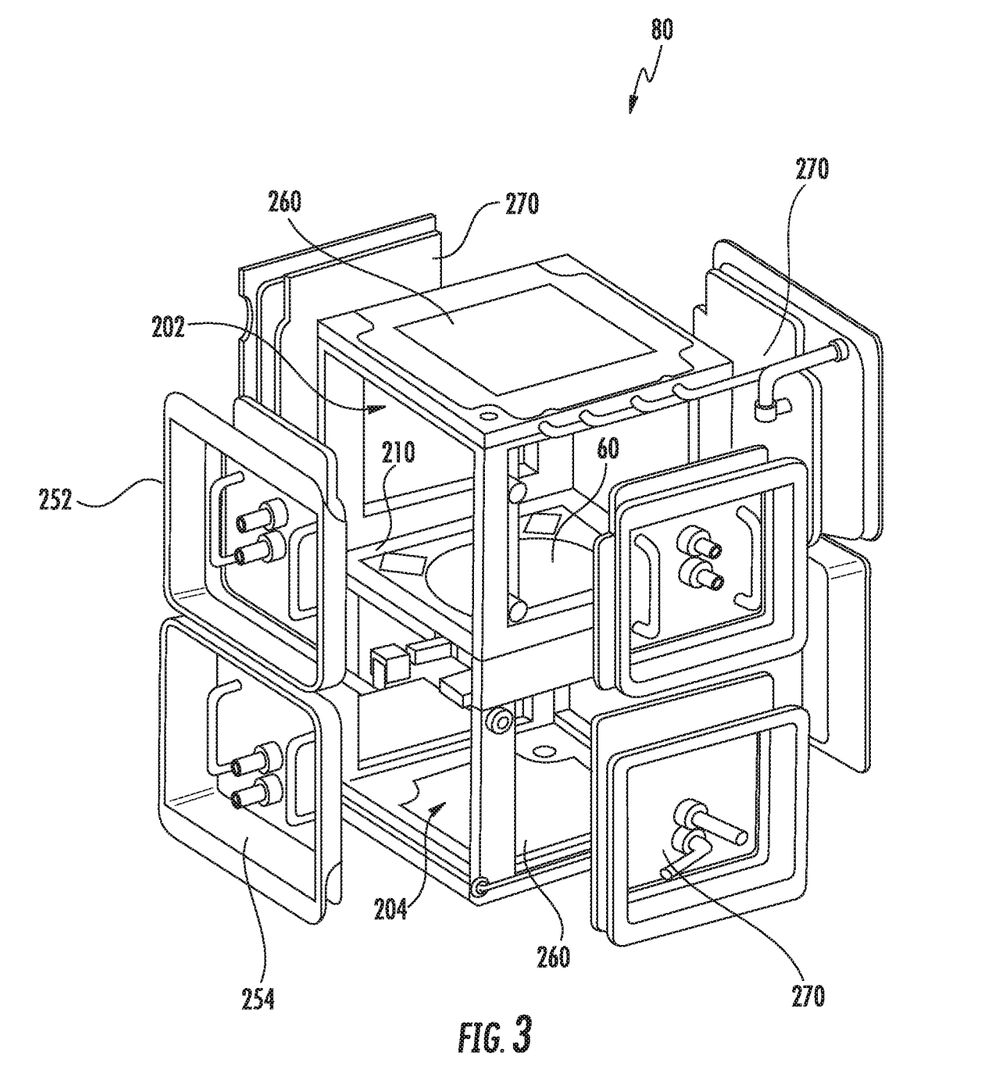
FIG. 3 depicts an exploded view of an example millisecond anneal system according to example embodiments of the present disclosure.
Figure 4:
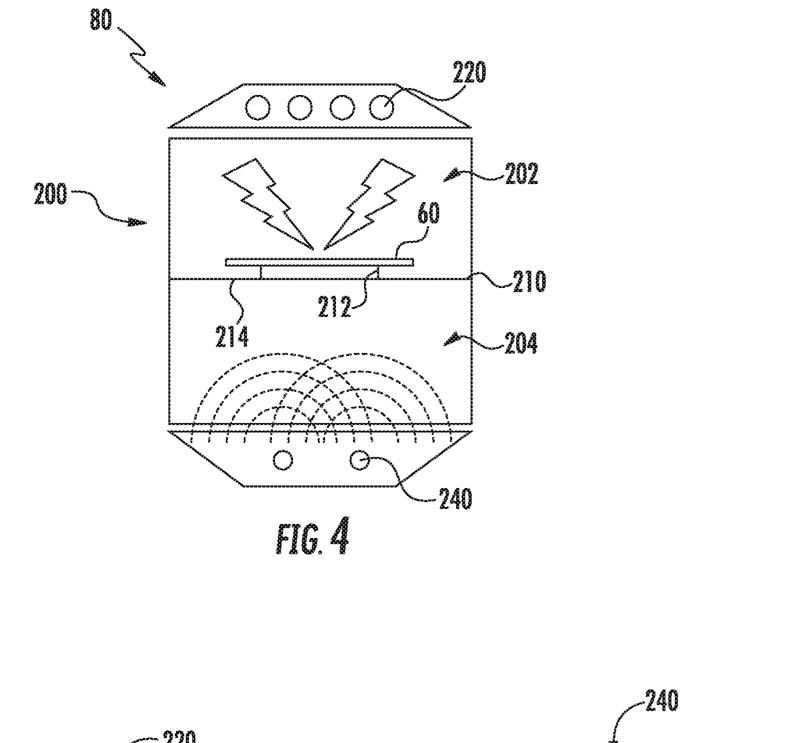
FIG. 4 depicts a cross-sectional view of an example millisecond anneal system according to example embodiments of the present disclosure.

FIGS. 2 to 5 depict various aspects of an example millisecond anneal system 80 according to example embodiments of the present disclosure. As shown in FIGS. 2-4, a millisecond anneal system 80 can include a process chamber 200. The process chamber 200 can be divided by a wafer plane plate 210 into a top chamber 202 and a bottom chamber 204. A semiconductor substrate 60 (e.g., a silicon wafer) can be supported by support pins 212 (e.g., quartz support pins) mounted to a wafer support plate 214 (e.g., quartz glass plate inserted into the wafer plane plate 210).

As shown in FIGS. 2 and 4, the millisecond anneal system 80 can include a plurality of arc lamps 220 (e.g., four Argon arc lamps) arranged proximate the top chamber 202 as light sources for intense millisecond long exposure of the top surface of the semiconductor substrate 60—the so called "flash." The flash can be applied to the semiconductor substrate when the substrate has been heated to an intermediate temperature (e.g., about 450° C. to about 900° C.).

A plurality of continuous mode arc lamps 240 (e.g., two Argon arc lamps) located proximate the bottom chamber 204 can be used to heat the semiconductor substrate 60 to the intermediate temperature. In some embodiments, the heating of the semiconductor substrate 60 to the intermediate temperature is accomplished from the bottom chamber 204 through the bottom surface of the semiconductor substrate at a ramp rate which heats the entire bulk of the semiconductor substrate 60.

As shown in FIG. 3, the light to heat the semiconductor substrate 60 from the bottom arc lamps 240 (e.g., for use in heating the semiconductor substrate to an intermediate temperature) and from the top arc lamps 220 (e.g., for use in providing millisecond heating by flash) can enter the processing chamber 200 through water windows 260 (e.g., water cooled quartz glass windows). In some embodiments, the water windows 260 can include a sandwich of two quartz glass panes between which an about a 4 mm thick layer of water is circulating to cool the quartz panes and to provide an optical filter for wavelengths, for instance, above about 1400 nm.

Figure 5:
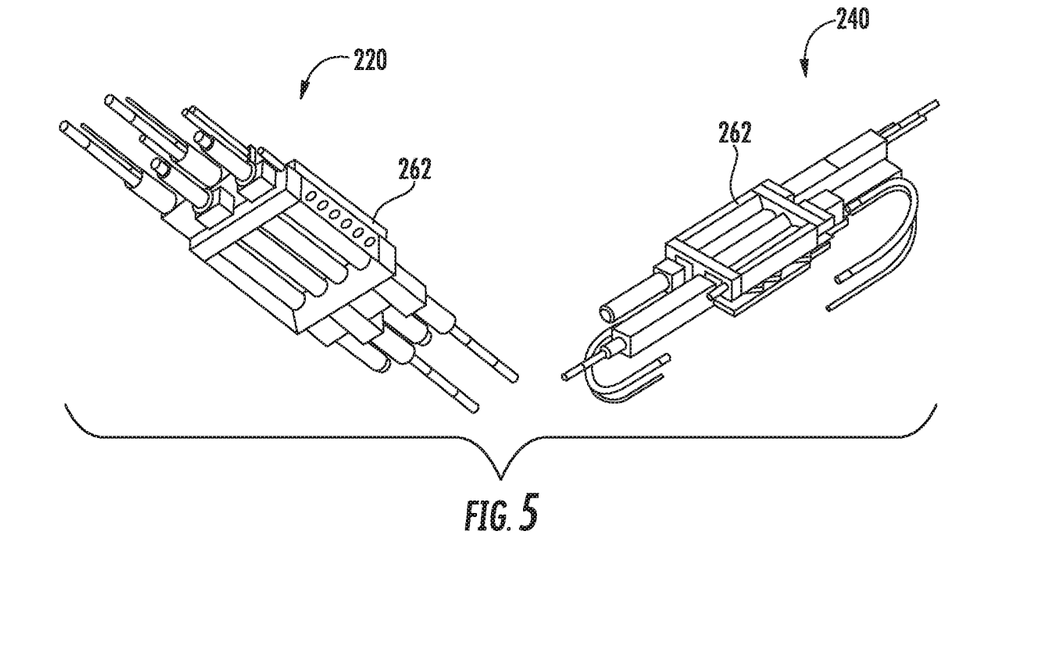
FIG. 5 depicts a perspective view of example lamps used in a millisecond anneal system according to example embodiments of the present disclosure.

As further illustrated in FIG. 3, process chamber walls 250 can include reflective mirrors 270 for reflecting the heating light. The reflective mirrors 270 can be, for instance, water cooled, polished aluminum panels. In some embodiments, the main body of the arc lamps used in the millisecond anneal system can include reflectors for lamp radiation. For instance, FIG. 5 depicts a perspective view of both a top lamp array 220 and a bottom lamp array 240 that can be used in the millisecond anneal system 200. As shown, the main body of each lamp array 220 and 240 can include a reflector 262 for reflecting the heating light. These reflectors 262 can form a part of the reflecting surfaces of the process chamber 200 of the millisecond anneal system 80.

The temperature uniformity of the semiconductor substrate can be controlled by manipulating the light density falling onto different regions of the semiconductor substrate. In some embodiments, uniformity tuning can be accomplished by altering the reflection grade of small size reflectors to the main reflectors and/or by use of edge reflectors mounted on the wafer support plane surrounding the wafer.

Figure 6:
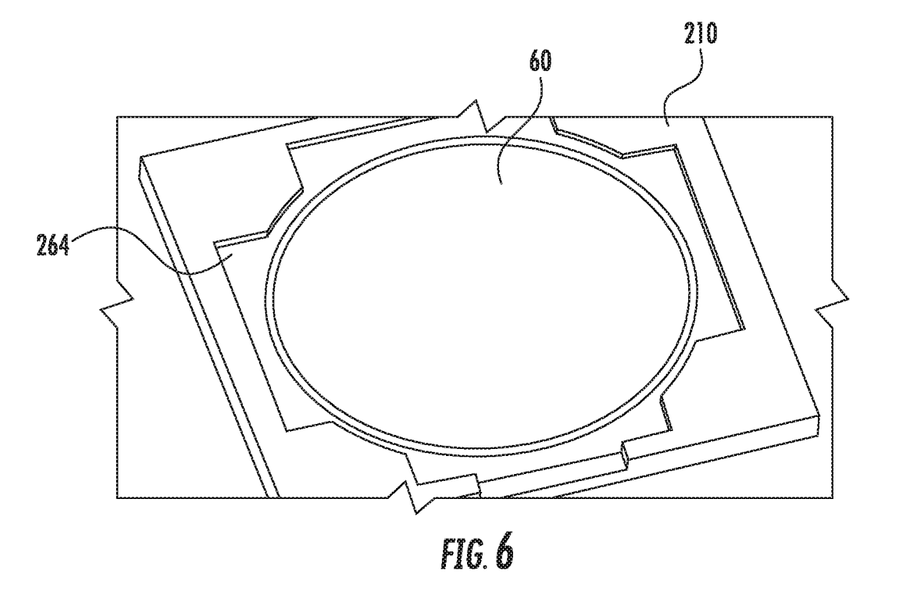
FIG. 6 depicts example edge reflectors used in a wafer plane plate of a millisecond anneal system according to example embodiments of the present disclosure.

For instance, edge reflectors can be used to redirect light from the bottom lamps 240 to an edge of the semiconductor substrate 60. As an example, FIG. 6 depicts example edge reflectors 264 that form a part of the wafer plane plate 210 that can be used to direct light from the bottom lamps 240 to the edge of the semiconductor substrate 60. The edge reflectors 264 can be mounted to the wafer plane plate 210 and can surround or at least partially surround the semiconductor substrate 60.

Figure 7:
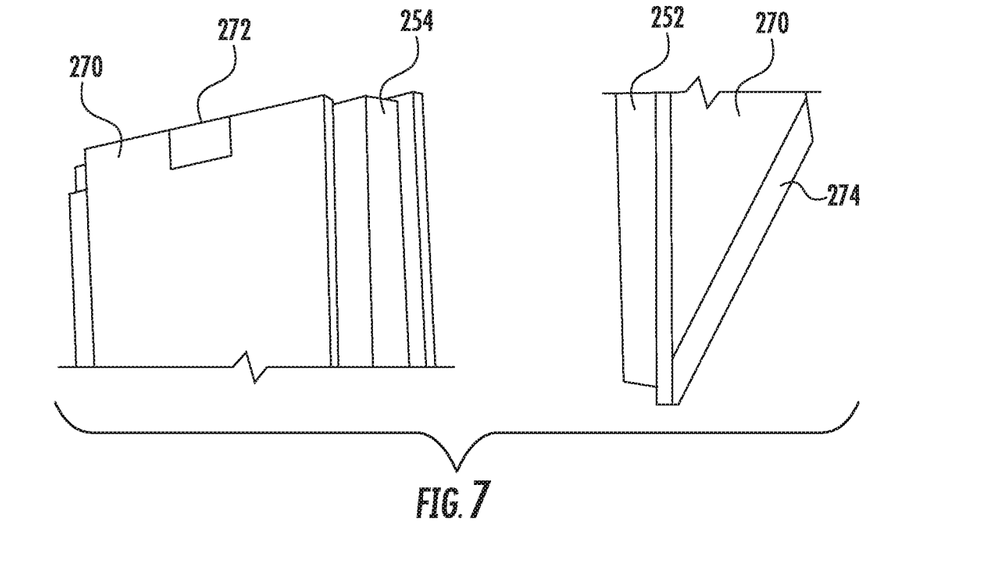
FIG. 7 depicts example reflectors that can be used in a millisecond anneal system according to example embodiments of the present disclosure.

In some embodiments, additional reflectors can also be mounted on chamber walls near the wafer plane plate 210. For example, FIG. 7 depicts example reflectors that can be mounted to the process chamber walls that can act as reflector mirrors for the heating light. More particularly, FIG. 7 shows an example wedge reflector 272 mounted to lower chamber wall 254. FIG. 7 also illustrates a reflective element 274 mounted to reflector 270 of an upper chamber wall 252. Uniformity of processing of the semiconductor substrate 60 can be tuned by changing the reflection grade of the wedge reflectors 272 and/or other reflective elements (e.g., reflective element 274) in the processing chamber 200.

Figure 8:
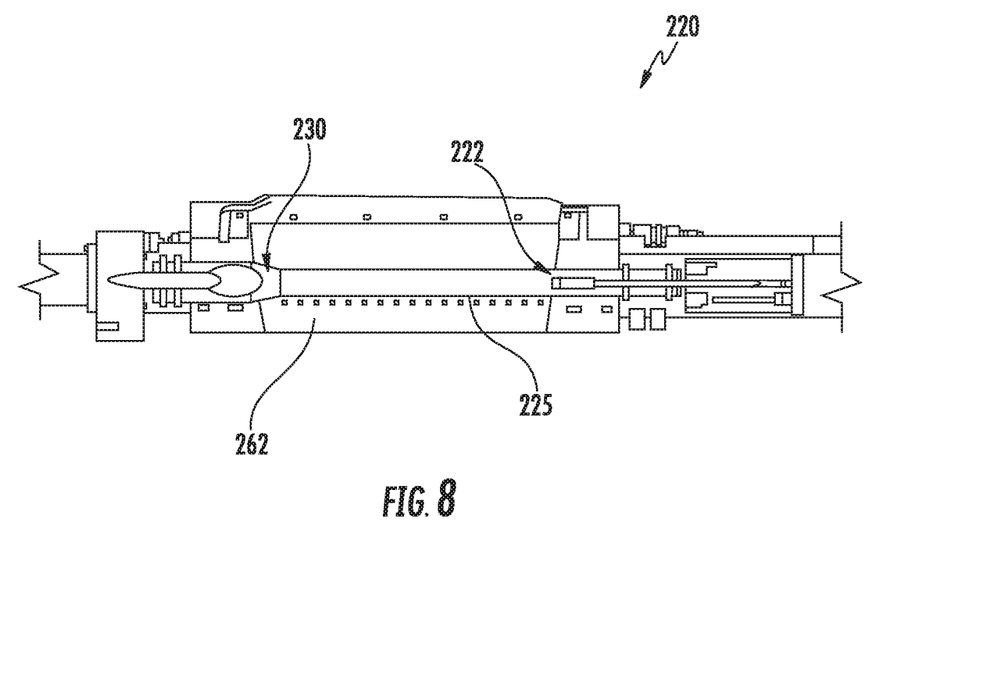
FIG. 8 depicts an example arc lamp that can be used in a millisecond anneal system according to example embodiments of the present disclosure.
Figure 9:
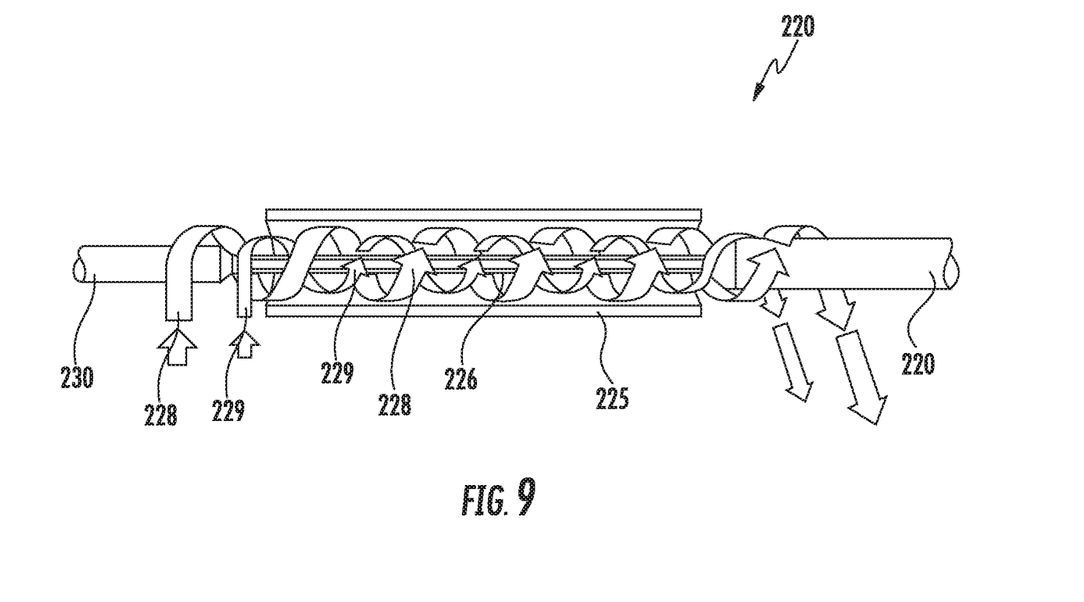
FIGS. 9-10 depict the operation of an example arc lamp according to example embodiments of the present disclosure.

FIGS. 8-11 depict aspects of example upper arc lamps 220 that can be used as light sources for intense millisecond long exposure of the top surface of the semiconductor substrate 60 (e.g., the "flash"). For instance, FIG. 8 depicts a cross-sectional view of an example arc lamp 220. The arc lamp 220 can be, for instance, an open flow arc lamp, where pressurized Argon gas (or other suitable gas) is converted into a high pressure plasma during an arc discharge. The arc discharge takes place in a quartz tube 225 between a negatively charged cathode 222 and a spaced apart positively charged anode 230 (e.g., spaced about 300 mm apart). As soon as the voltage between the cathode 222 and the anode 230 reaches a breakdown voltage of Argon (e.g., about 30 kV) or other suitable gas, a stable, low inductive plasma is formed which emits light in the visible and UV range of the electromagnetic spectrum. As shown in FIG. 9, the lamp can include a lamp reflector 262 that can be used to reflect light provided by the lamp for processing of the semiconductor substrate 60.

Figure 10:
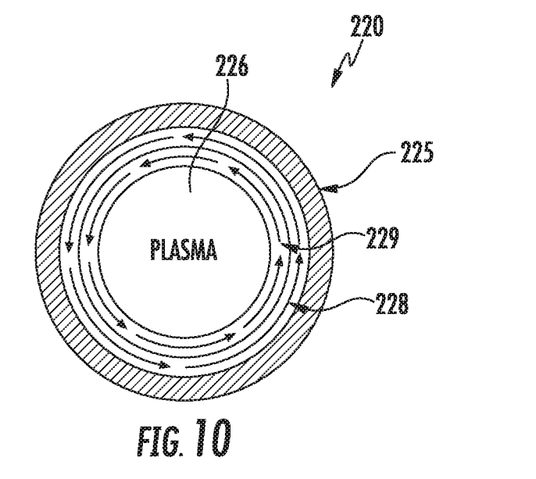
Figure 11:
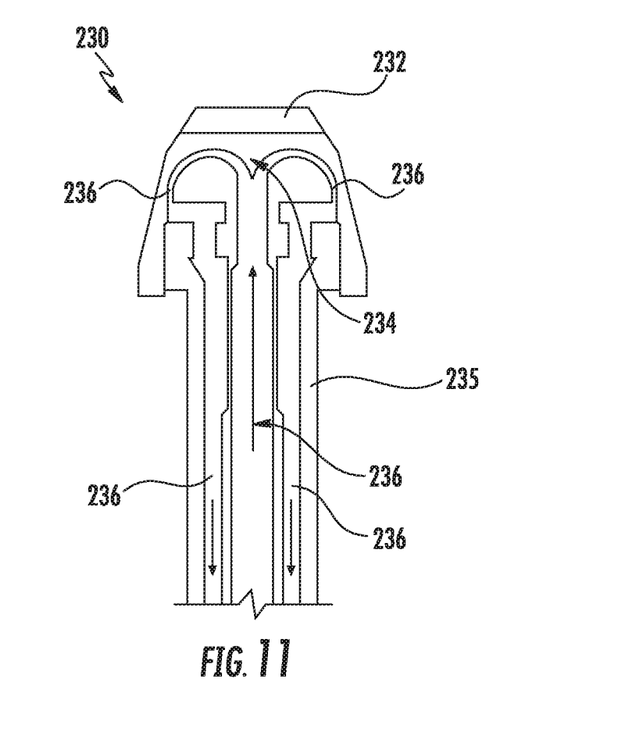
FIG. 11 depicts a cross-sectional view of an example electrode according to example embodiments of the present disclosure.

FIGS. 10 and 11 depict aspects of example operation of an arc lamp 220 in millisecond anneal system 80 according to example embodiments of the present disclosure. More particularly, a plasma 226 is contained within a quartz tube 225 which is water cooled from the inside by a water wall 228. The water wall 228 is injected at high flow rates on the cathode end of the lamp 200 and exhausted at the anode end. The same is true for the Argon gas 229, which is also entering the lamp 220 at the cathode end and exhausted from the anode end. The water forming the water wall 228 is injected perpendicular to the lamp axis such that the centrifugal action generates a water vortex. Hence, along the center line of the lamp a channel is formed for the Argon gas 229. The Argon gas column 229 is rotating in the same direction as the water wall 228. Once a plasma 226 has formed, the water wall 228 is protecting the quartz tube 225 and confining the plasma 226 to the center axis. Only the water wall 228 and the electrodes (cathode 230 and anode 222) are in direct contact with the high energy plasma 226.

FIG. 11 depicts a cross sectional view of an example electrode (e.g., cathode 230) used in conjunction with an arc lamp according to example embodiments of the present disclosure. FIG. 11 depicts a cathode 230. However, a similar construction can be used for the anode 222.

In some embodiments, as the electrodes experience a high heat load, one or more of the electrodes can each include a tip 232. The tip can be made from tungsten. The tip can be coupled to and/or fused to a water cooled copper heat sink 234. The copper heat sink 234 can include at least a portion the internal cooling system of the electrodes (e.g., one or more water cooling channels 236. The electrodes can further include a brass base 235 with water cooling channels 236 to provide for the circulation of water or other fluid and the cooling of the electrodes.

The arc lamps used in example millisecond anneal systems according to aspects of the present disclosure can be an open flow system for water and Argon gas. However, for conservation reasons, both media can be circulated in a close loop system in some embodiments. In some embodiments, nitrogen gas can be injected into the arc lamp during operation to control the pH of water circulating through the arc lamp during operation. An example water loop system will be discussed in detail with respect to FIG. 14.

Figure 12:
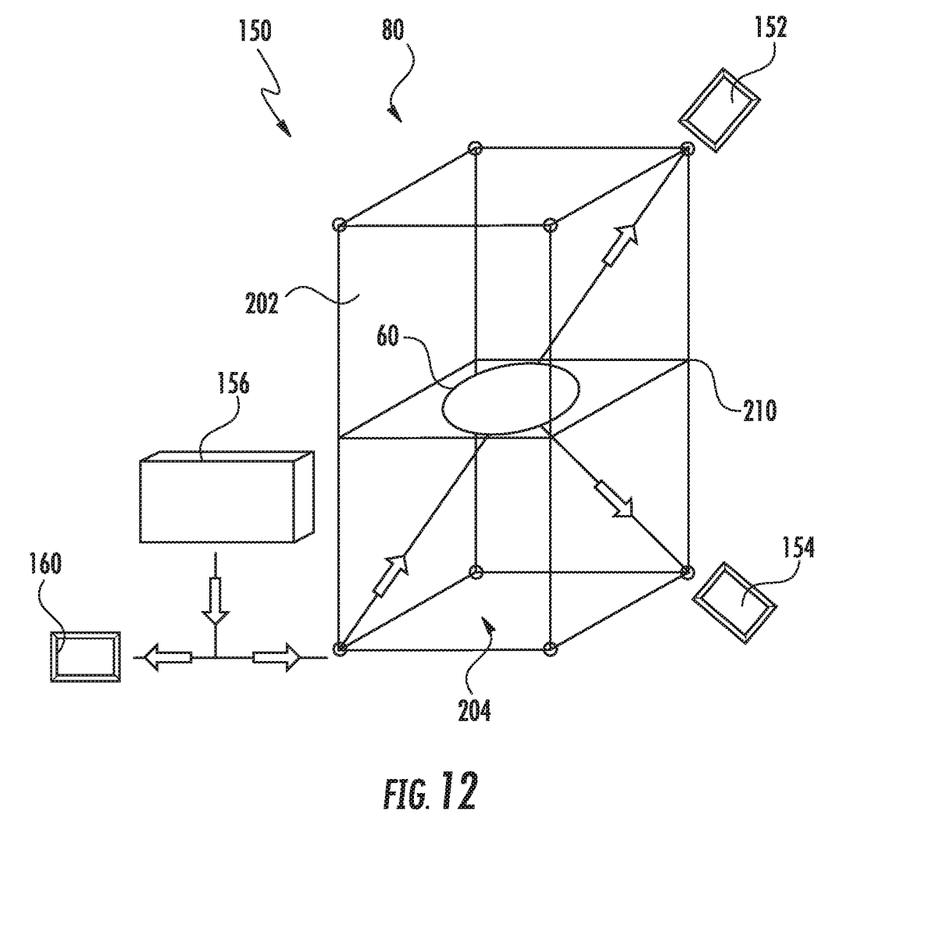
FIG. 12 depicts an example temperature measurement system for a millisecond anneal system according to example embodiments of the present disclosure.

Millisecond anneal systems according to example embodiments of the present disclosure can include the ability to independently measure temperature of both surfaces (e.g., the top and bottom surfaces) of the semiconductor substrate. FIG. 12 depicts an example temperature measurement system 150 for millisecond anneal system 200.

A simplified representation of the millisecond anneal system 200 is shown in FIG. 12 The temperature of both sides of a semiconductor substrate 60 can be measured independently by temperature sensors, such as temperature sensor 152 and temperature sensor 154. Temperature sensor 152 can measure a temperature of a top surface of the semiconductor substrate 60. Temperature sensor 154 can measure a bottom surface of the semiconductor substrate 60. In some embodiments, narrow band pyrometric sensors with a measurement wavelength of about 1400 nm can be used as temperature sensors 152 and/or 154 to measure the temperature of, for instance, a center region of the semiconductor substrate 60. In some embodiments, the temperature sensors 152 and 154 can be ultra-hist radiometers (UFR) that have a sampling rate that is high enough to resolve the millisecond temperature spike cause by the flash heating.

The readings of the temperature sensors 152 and 154 can be emissivity compensated. As shown in FIG. 12, the emissivity compensation scheme can include a diagnostic flash 156, a reference temperature sensor 158, and the temperature sensors 152 and 154 configured to measure the top and bottom surface of the semiconductor substrates. Diagnostic heating and measurements can be used with the diagnostic flash 156 (e.g., a test flash). Measurements from reference temperature sensor 158 can be used for emissivity compensation of temperature sensors 152 and 154.

In some embodiments, the millisecond anneal system 200 can include water windows. The water windows can provide an optical filter that suppresses lamp radiation in the measurement band of the temperature sensors 152 and 154 so that the temperature sensors 152 and 154 only measure radiation from the semiconductor substrate.

The readings of the temperature sensors 152 and 154 can be provided to a processor circuit 160. The processor circuit 10 can be located within a housing of the millisecond anneal system 200, although alternatively, the processor circuit 160 may be located remotely from the millisecond anneal system 200. The various functions described herein may be performed by a single processor circuit if desired, or by other combinations of local and/or remote processor circuits.

EXAMPLE NITROGEN INJECTION FOR LAMPS IN A MILLISECOND ANNEAL SYSTEM

According to example aspects of the present disclosure, the pH-value of the water used in arc lamps of a millisecond anneal system can be controlled to be in a range of, for instance about 6.5 to about 7 by controlling the concentration of acids formed from the reaction of nitrogen or other reagent with water in the presence of a high-energy plasma. In some embodiments, nitrogen gas or other reagent can be added to the water and the high-energy plasma inside the lamp during operation to control the concentration of nitrous and nitric acid.

More particularly, a cascade of chemical reactions scan start by the formation of nitrogen monoxide through the basic reaction $N_2+O_2 \rightarrow 2NO$ taking place in a plasma discharge with temperatures exceeding 3000 K. The reaction partner $O_2$ is generated in the arc lamp itself from the dissociation reaction of water, and does not need to be added.

Nitrogen monoxide immediately reacts with oxygen to form nitrogen dioxide $2NO+O_2 \rightarrow 2NO_2$. In the presence of water, nitrogen dioxide forms nitrous and nitric acid $2NO_2+H_2O \rightarrow HNO_2+HNO_3$. Nitric acid is a strong acid and lowers pH by the following reaction $HNO_3+H_2O \rightarrow H_3O^++NO_3^-$. Nitrous acid is a weak acid and lowers pH by the equilibrium reaction $HNO_2+H_2O \rightleftharpoons H_3O^++NO_2^-$. The ions formed in the last two reactions also lower the water resistivity and can be removed by the ion exchange filters. Other suitable reactions can be used to adjust the pH without deviating from the scope of the present disclosure.

Figure 13:
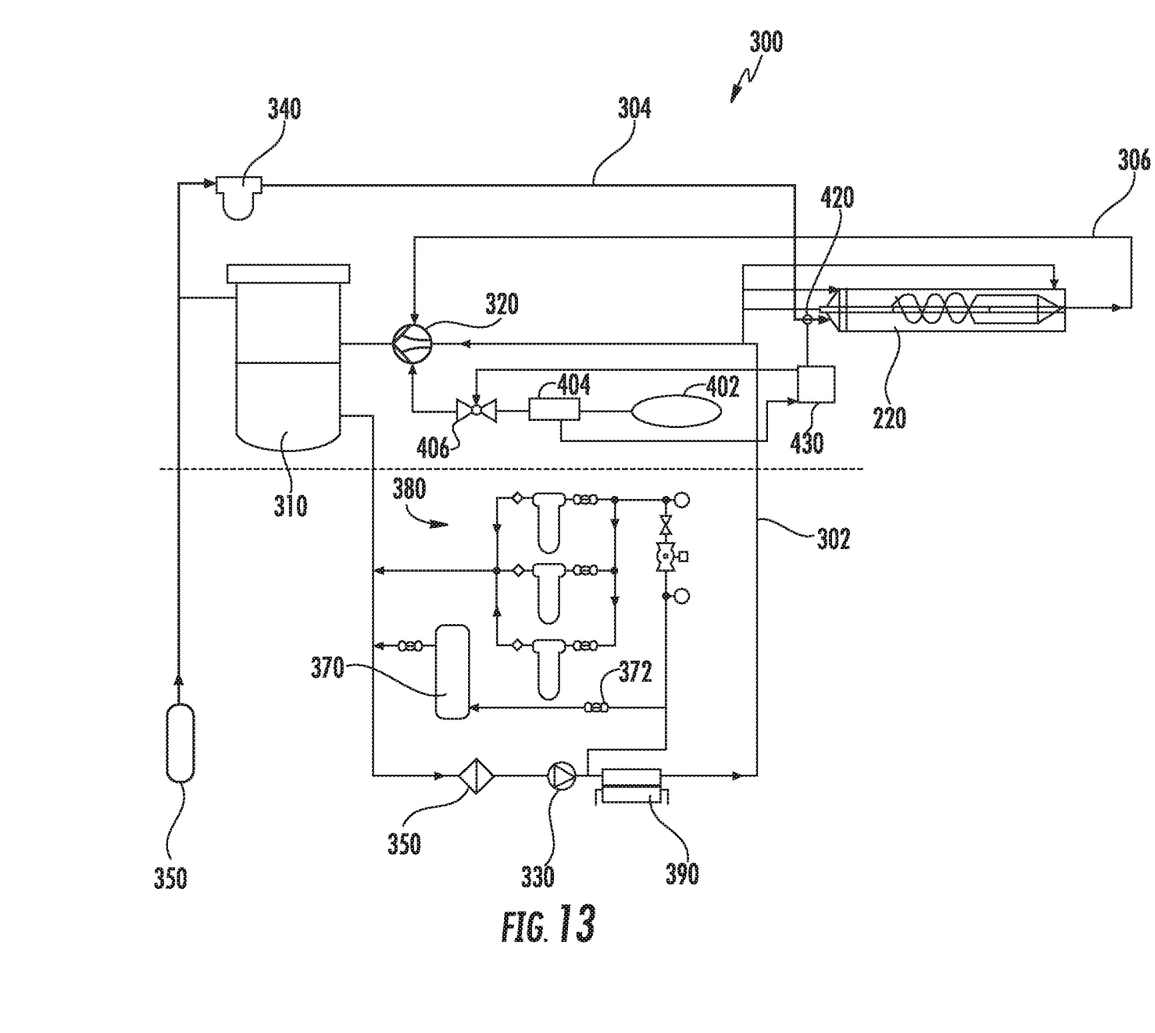
FIG. 13 depicts an example lamp water loop with nitrogen gas injection and a pH sensor according to example embodiments of the present disclosure.

FIG. 13 depicts example lamp water loop 300 with nitrogen gas injection for supplying water and Argon gas needed to operate the open flow Argon arc lamps used in millisecond anneal systems according to example embodiments of the present disclosure More particularly, high purity water 302 and Argon 304 is fed to the lamp 220. The high purity water 302 is used for the water wall and the cooling of the electrodes. Leaving the lamp is a gas/water mixture 306. This water/gas mixture 306 is separated into gas free water 302 and dry Argon 304 by separator 310 before it can be re-fed to the inlets of the lamp 220. To generate the required pressure drop across the lamp 220, the gas/water mixture 306 is pumped by means of a water driven jet pump 320.

A high power electric pump 330 supplies the water pressure to drive the water wall in the lamp 220, the cooling water for the lamp electrodes, and the motive flow for the jet pump 320. The separator 310 downstream to the jet pump 320 can be used to extract the liquid and the gaseous phase from the mixture (Argon). Argon is further dried in a coalescing filter 340 before it re-enters the lam 220. Additional Argon can be supplied from Argon source 350 if needed.

The water is passing through one or more particle filters 350 to remove particles sputtered into the water by the arc. Ionic contaminations are removed by ion exchange resins. A portion of water is run through mixed bed ion exchange filters 370. The inlet valve 372 to the ion exchange bypass 370 can be controlled by the water resistivity. If the water resistivity drops below a lower value the valve 372 is opened, when it reaches an upper value the valve 372 is closed. The system can contain an activated carbon filter bypass loop 380 where a portion of the water can be additionally filtered to remove organic contaminations. To maintain the water temperature, the water can pass through a heat exchanger 390.

According to example embodiments, nitrogen gas can be injected from a nitrogen gas injection source 402, for instance, at a low pressure point of the water loop. For instance, as shown in FIG. 13, nitrogen gas ($N_2$) can be injected from nitrogen gas injection source 402 at a suction port of the jet pump 320. Since the amount of nitrogen needed is very small, the gas can be metered by a mass flow controller 404. The flow of nitrogen gas can be switched on and off by one or more nitrogen gas injection valves 406. In some embodiments, the one or more nitrogen gas injection valves include a control valve, such as solenoid valve. In some embodiments, the supply pressure of the nitrogen gas can exceed the pressure at the suction port by more than about 2%.

In some embodiments, the system can include a pH sensor 420 and one or more control devices 430 to control the injection of nitrogen gas from the nitrogen gas source 402. The pH sensor 420 can be configured to measure the pH of water circulating in the water loop at one or more locations in the water loop. The control devices 430 can include any suitable control device for controlling the nitrogen gas source 402. For instance, the control device 430 can be configured to provide control signals to valve 406 to open and/or close the valve 406.

The control device 430 can include any suitable control device that can send control signals to regulate aspects of the millisecond anneal system. In some embodiments, the control device 430 can include one or more processors and one or more memory devices. The one or more processors can execute computer-readable instructions stored in the one or more memory devices to perform the control functions disclosed herein. The control device 430 can be a standalone control device or part of an overall control system associated with the millisecond anneals system.

In some embodiments, the injection of nitrogen gas from the nitrogen gas source 402 is controlled, by one or more control devices 430, based at least in part based on data indicative of the pH-value of the water obtained, for instance, from a pH sensor 420 and the lamp operating status (e.g., lamp on or lamp off). For example, if the pH is above an upper limit (e.g., pH value of about 7.0) and the lamp operating status is on, the injection valve is opened. If the pH drops below a lower limit (e.g., pH-value of 6.5) or the lamp operating status is off, the injection valve is closed.

A reason for making the nitrogen injection dependent on the lamp operation lies in the following: the pH lowering reaction can require an arc discharge, which means the lamps need to be turned on. Without arc discharge, the nitrogen gas is only being dissolved in the water. If added above the solubility limit it will build up in gaseous form. If at a later time the lamps are ignited and the reaction finally takes place, a burst of nitric/nitrous acid is released, which suddenly lowers the pH and resistivity, leading to difficulties in control. Table 1 provides a summary of operation of the nitrogen gas injection valve according to example embodiments of the present disclosure.

TABLE 1

| pH-value | Lamp operation | N2-injection valve |
| --- | --- | --- |
| Above upper limit | on | on |
| Above upper limit | off | off |
| Below lower limit | on | off |
| Below lower limit | off | off |

Figure 14:
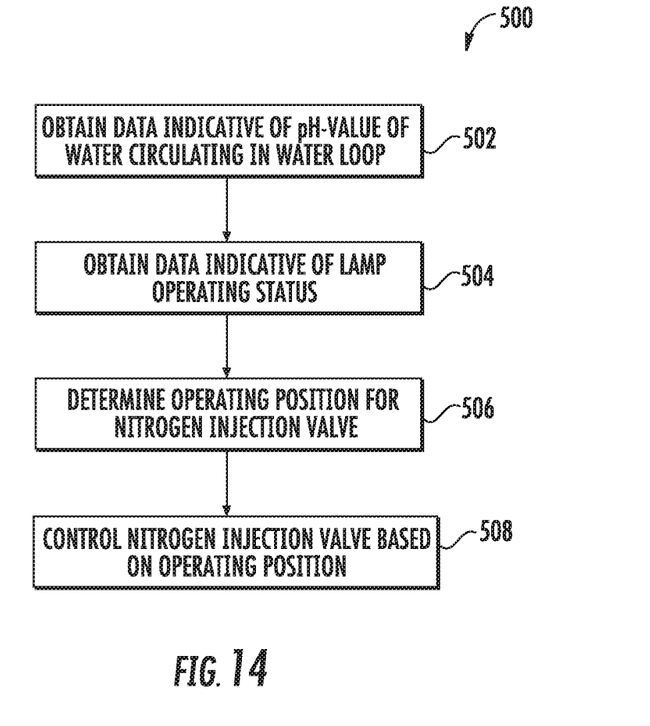
FIG. 14 depicts an example method according to example embodiments of the present disclosure.

FIG. 14 depicts a flow diagram of an example method (500) according to example embodiments of the present disclosure. The method (500) can be implemented by one or more control devices in a millisecond anneal system, such as control devices 430. In addition, FIG. 14 depicts steps performed in a particular order for purposes of illustration and discussion. Those of ordinary skill in the art, using the disclosures provided herein, will understand that the steps of any of the methods disclosed herein can be adapted, modified, expanded, rearranged and/or omitted in various ways without deviating from the scope of the present disclosure.

At (502), the method includes obtaining data indicative of a pH-value of water circulating in the close loop for circulating water through an arc lamp in a millisecond anneal system. For instance, control device(s) 430 of FIG. 13 can obtain data indicative of the pH-value of water circulating in system 300 from pH sensor 420.

At (504), the method include obtaining data indicative of an operating status of the arc lamp. For instance, the control device(s) 430 can obtain data indicating whether the arc lamp is in an on operating state or in an off operating state.

At (506), the method can include determining an operating position for a nitrogen gas injection valve for injecting nitrogen gas into the water loop based at least in part on the data indicative of the pH-value and the data indicative of the operating state. For instance, the control device(s) 430 can determine that the nitrogen injection valve is to be opened when the pH-value of the water is above an upper limit and the state of arc lamp operation is an on state. The operating position for the nitrogen injection valve can be determined to be closed when the state of arc lamp operation is an off state. The operating position for the nitrogen injection valve can be determined to be closed when the pH-value of the water is below a lower limit.

At (508), the method can include controlling the nitrogen injection valve based at least in part on the determined operating position. For instance, the control device(s) 430 can send control signals to valve 406 (e.g., solenoid valves) to open and or close the nitrogen injection valve 406 based on the determined operating position.

Variations and modifications can be made to these example embodiments of the present disclosure. For instance, in some embodiments, the injection valve can be opened and closed time controlled or by means of the water resistivity. In some embodiments, the nitrogen gas is supplied by a metering pump. In some embodiments, the flow of gas can be based at least in part on a pressure differential between supply pressure and suction port pressure.

An advantage of using nitrogen gas over liquid or solid agents to lower/control the pH-value of water stems from the fact that $N_2$ is available already as process gas for the thermal treatment of semiconductor substrate, therefore it is a very clean and not exhaustible source of pH lowering agent. In addition, nitrogen gas can be very accurately metered by means of mass flow controllers. Furthermore, nitrogen is naturally present in the water after the water loop has been filled with fresh water. However, during the first hours of lamp operation, the nitrogen reactions and the subsequent removal of the reaction products by the ion exchange filters, result in a depletion of nitrogen. Injection of $N_2$ can therefore be seen as a way of maintaining or restoring the "natural" $N_2$ level of the water.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method of operating a water loop for circulating water through an arc lamp in a millisecond anneal system, the method comprising:
    obtaining, by one or more control devices comprising one or more processors; data indicative of a pH-value of water circulating through the water loop;
    obtaining, by the one or more control devices, data indicative of the state of arc lamp operation;
    adjusting a pH-value of the water circulating through the arc lamp based at least in part on the data indicative of the pH-value of the water;
    wherein adjusting the pH-value of the water circulating through the arc lamp comprises controlling, by the one or more control devices, a flow of nitrogen gas into the water circulating through the arc lamp.

2. The method of claim 1, wherein adjusting a pH-value of the water circulating through the arc lamp comprises:
    determining, by the one or more control devices, an operating position for a nitrogen injection valve for injecting nitrogen into the water loop based at least in part on the data indicative of the pH-value of water circulating through the arc lamp and the data indicative of the state of arc lamp operation; and controlling, by the one or more control devices, the nitrogen injection valve based on the determined operating position.

3. The method of claim 2, wherein the operating position for the nitrogen injection valve is determined to be open when the pH-value of the water is above an upper limit and the state of arc lamp operation is an on state.

4. The method of claim 3, wherein the operating position for the nitrogen injection valve is determined to be closed when the state of arc lamp operation is an off state.

5. The method of claim 4, wherein the operating position for the nitrogen injection valve is determined to be closed when the pH-value of the water is below a lower limit.

6. The method of claim 5, wherein the upper limit is about 7.0 and the lower limit is about 6.5.

7. A method of operating a water loop for circulating water through an arc lamp in a millisecond anneal system, the method comprising:

obtaining, by one or more control devices comprising one or more processors, data indicative of a pH-value of water circulating through the water loop;

obtaining, by the one or more control devices, data indicative of the state of arc lamp operation;

adjusting a pH-value of the water circulating through the arc lamp based at least in part on the data indicative of the pH-value of the water, wherein adjusting a pH-value of the water circulating through the arc lamp comprises:
 determining, by the one or more control devices, an operating position for a nitrogen injection valve for injecting nitrogen into the water loop based at least in part on the data indicative of the pH-value of water circulating through the arc lamp and the data indicative of the state of arc lamp operation; and
 controlling, by the one or more control devices, the nitrogen injection valve based on the determined operating position, and wherein the operating position for the nitrogen injection valve is determined to be open when the pH-value of the water is above an upper limit and the state of arc lamp operation is an on state.

8. A method of operating a water loop for circulating water through an arc lamp in a millisecond anneal system, the method comprising:

obtaining, by one or more control devices comprising one or more processors, data indicative of a pH-value of water circulating through the water loop;

obtaining, by the one or more control devices, data indicative of the state of arc lamp operation; and controlling, by the one or more control devices, a flow of non-plasma-generating gas into the water circulating through the arc lamp based at least in part on the data indicative of the pH of the water circulating through the arc lamp and the data indicative of the state of arc lamp operation to adjust a pH-value of the water circulating through the arc lamp.

9. The method of claim 8, wherein the non-plasma-generating gas comprises nitrogen.

* * * * *